US007008484B2

(12) United States Patent
Yim et al.

(10) Patent No.: US 7,008,484 B2
(45) Date of Patent: Mar. 7, 2006

(54) METHOD AND APPARATUS FOR DEPOSITION OF LOW DIELECTRIC CONSTANT MATERIALS

(75) Inventors: Kang Sub Yim, Mountain View, CA (US); Soovo Sen, Sunnyvale, CA (US); Dian Sugiarto, Sunnyvale, CA (US); Peter Lee, San Jose, CA (US); Ellie Yieh, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 533 days.

(21) Appl. No.: 10/140,324

(22) Filed: May 6, 2002

(65) Prior Publication Data

US 2003/0207033 A1    Nov. 6, 2003

(51) Int. Cl.
*C23C 16/00* (2006.01)
*C23F 1/00* (2006.01)
*H01L 21/306* (2006.01)

(52) U.S. Cl. .............. 118/715; 156/345.33; 156/345.34
(58) Field of Classification Search ................ 118/715, 118/728, 50; 156/345.29, 345.33, 345.34
See application file for complete search history.

(56) References Cited

U.S. PATENT DOCUMENTS

| 4,262,631 | A | | 4/1981 | Kubacki ............... 118/723 MP |
|---|---|---|---|---|
| 4,532,150 | A | | 7/1985 | Endo et al. ................. 427/577 |
| 4,634,601 | A | | 1/1987 | Hamakawa et al. ........ 438/485 |
| 4,759,947 | A | | 7/1988 | Ishihara et al. ............. 427/568 |
| 5,024,748 | A | * | 6/1991 | Fujimura ............... 204/298.38 |
| 5,238,866 | A | | 8/1993 | Bolz et al. .................. 427/595 |
| 5,465,680 | A | | 11/1995 | Loboda ....................... 117/84 |
| 5,685,914 | A | * | 11/1997 | Hills et al. ............... 118/723 E |
| 5,711,987 | A | | 1/1998 | Bearinger et al. ............. 427/7 |
| 5,728,223 | A | * | 3/1998 | Murakami et al. .......... 118/715 |
| 5,730,792 | A | | 3/1998 | Camilletti et al. ...... 106/287.14 |
| 5,776,235 | A | | 7/1998 | Camilletti et al. ....... 106/287.1 |
| 5,780,163 | A | | 7/1998 | Camilletti et al. .......... 428/446 |
| 5,818,071 | A | | 10/1998 | Loboda et al. ................ 257/77 |
| 6,054,379 | A | | 4/2000 | Yau et al. .................... 438/623 |
| 6,072,227 | A | | 6/2000 | Yau et al. .................... 257/642 |
| 6,132,512 | A | * | 10/2000 | Horie et al. ................ 118/715 |
| 6,140,226 | A | | 10/2000 | Grill et al. .................. 438/637 |
| 6,147,009 | A | | 11/2000 | Grill et al. .................. 438/780 |
| 6,159,871 | A | | 12/2000 | Loboda et al. .............. 438/786 |

(Continued)

FOREIGN PATENT DOCUMENTS

EP            0 613 179          8/1994

OTHER PUBLICATIONS

U.S. Appl. No. 09/247,381, filed, Feb. 19, 2002, Cheung et al.

(Continued)

*Primary Examiner*—Ruby Zervigon
(74) *Attorney, Agent, or Firm*—Patterson & Sheridan

(57) ABSTRACT

A showerhead adapted for distributing gases into a process chamber and a method for forming dielectric layers on a substrate are generally provided. In one embodiment, a showerhead for distributing gases in a processing chamber includes an annular body coupled between a disk and a mounting flange. The disk has a plurality of holes formed therethrough. A lip extends from a side of the disk opposite the annular body and away from the mounting flange. The showerhead may be used for the deposition of dielectric materials on a substrate. In one embodiment, silicon nitride and silicon oxide layers are formed on the substrate without removing the substrate from a processing chamber utilizing the showerhead of the present invention.

15 Claims, 7 Drawing Sheets

U.S. PATENT DOCUMENTS

| | | | |
|---|---|---|---|
| 6,287,990 B1 | 9/2001 | Cheung et al. | 438/780 |
| 6,303,523 B1 | 10/2001 | Cheung et al. | 438/780 |
| 6,340,435 B1 | 1/2002 | Bjorkman et al. | 216/72 |
| 6,454,860 B1 * | 9/2002 | Metzner et al. | 118/715 |
| 6,627,532 B1 * | 9/2003 | Gaillard et al. | 438/623 |

OTHER PUBLICATIONS

U.S. Appl. No. 09/338,470, filed, Jul. 2, 2002, Moghadam et al.
U.S. Appl. No. 09/370,371, filed, Jan. 28, 2003, Yau et al.
U.S. Appl. No. 09/465,233, filed Jan. 28, 2003, Yau et al.
U.S. Appl. No. 09/477,126, filed Dec. 30, 1999, Yau et al.
U.S. Appl. No. 09/553,461, filed Jul. 15, 2003, Huang et al.
U.S. Appl. No. 09/580,505, filed Mar. 25, 2003, Cheung et al.
U.S. Appl. No. 09/594,186, filed May 13, 2003, Cheung et al.
U.S. Appl. No. 09/594,187, filed Apr. 1, 2003, Cheung et al.
U.S. Appl. No. 09/957,551, filed Sep. 19, 2001, Cheung et al.
U.S. Appl. No. 09/957,681, filed Sep. 19, 2001, Cheung et al.
Xia, et al., "Silicon Carbide Cap Layers for Low Dielectric Constant Silicon Oxide Layers," Filed Mar. 28, 2001, U.S Appl. 09/820,439.

* cited by examiner

METHOD AND APPARATUS FOR DEPOSITION OF LOW DIELECTRIC CONSTANT MATERIALS

BACKGROUND OF THE INVENTION

1. Field of the Invention

Embodiments of the invention generally relate to a method and apparatus for chemical vapor deposition.

2. Background of the Related Art

Integrated circuits have evolved into complex devices that can include millions of components (e.g., transistor, capacitors and resistors) on a single chip. The evolution of chip design continually requires faster circuitry and greater circuit densities. Demands for greater circuit densities necessitates a reduction in the dimensions of the integrated circuit components.

As the dimensions of integrated circuit components are reduced, materials used to fabricate such components must be carefully selected in order to maximize the electrical performance of the circuit. For example, low resistivity metal interconnects (e.g., aluminum and copper) are typically used to provide conductive pathways between components of the integrated circuit. Typically, the metal interconnects are electrically isolated from each other by a bulk insulating material. When the distance between adjacent metal interconnects and/or the thickness of the bulk insulating material has sub-micron dimensions, capacitive coupling may potentially occur between such interconnects. Capacitive coupling between adjacent metal connectors interconnects causes cross-talk and/or resistance-capacitance (RC) delay, which degrades the overall performance of the integrated circuit.

The RC delay associated with interconnects is rapidly becoming the limiting factor in utilizing high-speed integrated circuits with design rules below 0.15 micron. The adoption of copper as a conductor of choice can improve the resistance component by almost a factor of two over that of aluminum. However, a reduction in the dielectric constant of the inter-metal dielectric material over that of silicon dioxide ($k \approx 4.1$) is also desirable to improve the capacitive component for future high-speed circuitry.

Two types of dielectric materials having low dielectric constants (k<3, also known as low-k materials) have been developed based on organosilane by method of plasma-enhanced chemical vapor deposition (PECVD). One material is a silicon carbide film typically utilized as an interlayer dielectric material and is available under the trade name BLACK DIAMOND™ film available from Applied Materials, Inc., located in Santa Clara, Calif. A second layer has been developed as a low-k barrier/etch stop silicon nitride film, available under the trade name BLOk™ film, also available from Applied Materials, Inc. However, these films cannot currently be deposited in a single chamber using a common process kit, which causes extra investment costs for the processor and reduces the flexibility of the processing system. The process kit generally includes a showerhead for distribution gases within the chamber and a purge ring, among other components.

Attempting deposition of one film using the process kit of the other has demonstrated poor deposition uniformity and unsatisfactorily high dielectric constants. As a result, separate processing chambers must be utilized for deposition of each type of dielectric film, limiting the flexibility of fabrication lines and increasing cost of tool ownership, or necessitating costly processing chamber downtime to allow replacement of one process kit for the other. Moreover, as separate chambers are required for deposition of each type of film, substrate throughput and process flexibility remains limited.

Therefore, is a need for a method and apparatus for chemical vapor deposition of various low-k dielectric materials utilizing a common process kit.

SUMMARY OF THE INVENTION

A showerhead adapted for distributing gases into a process chamber and a method for forming dielectric layers on a substrate are generally provided. In one embodiment, a showerhead for distributing gases in a processing chamber includes an annular body coupled between a disk and a mounting flange. The disk has a plurality of holes formed therethrough. A lip extends from a side of the disk opposite the annular body and away from the mounting flange. The showerhead may be used for the deposition of dielectric material on a substrate.

In another aspect of the invention, a processing chamber for deposition of dielectric layers is provided. In one embodiment, the processing chamber includes a chamber body having a substrate support and a disk disposed therein. The disk has a plurality of holes formed therethrough and is coupled to an annular body. The annular body is coupled to a mounting flange that couples the disk to a lid of the chamber body. A lip extends from the disk away from the mounting flange.

In another aspect of the invention, a method for forming dielectric layers on a substrate is provided. In one embodiment, a method for forming dielectric layers on a substrate includes the steps of transferring the substrate into a chemical vapor deposition chamber, forming a layer of silicon nitride on the substrate, and forming a layer of silicon oxide on the substrate without removing the substrate from the chamber.

BRIEF DESCRIPTION OF THE DRAWINGS

A more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION OF THE PREFERRED EMBODIMENT

Figure 1:
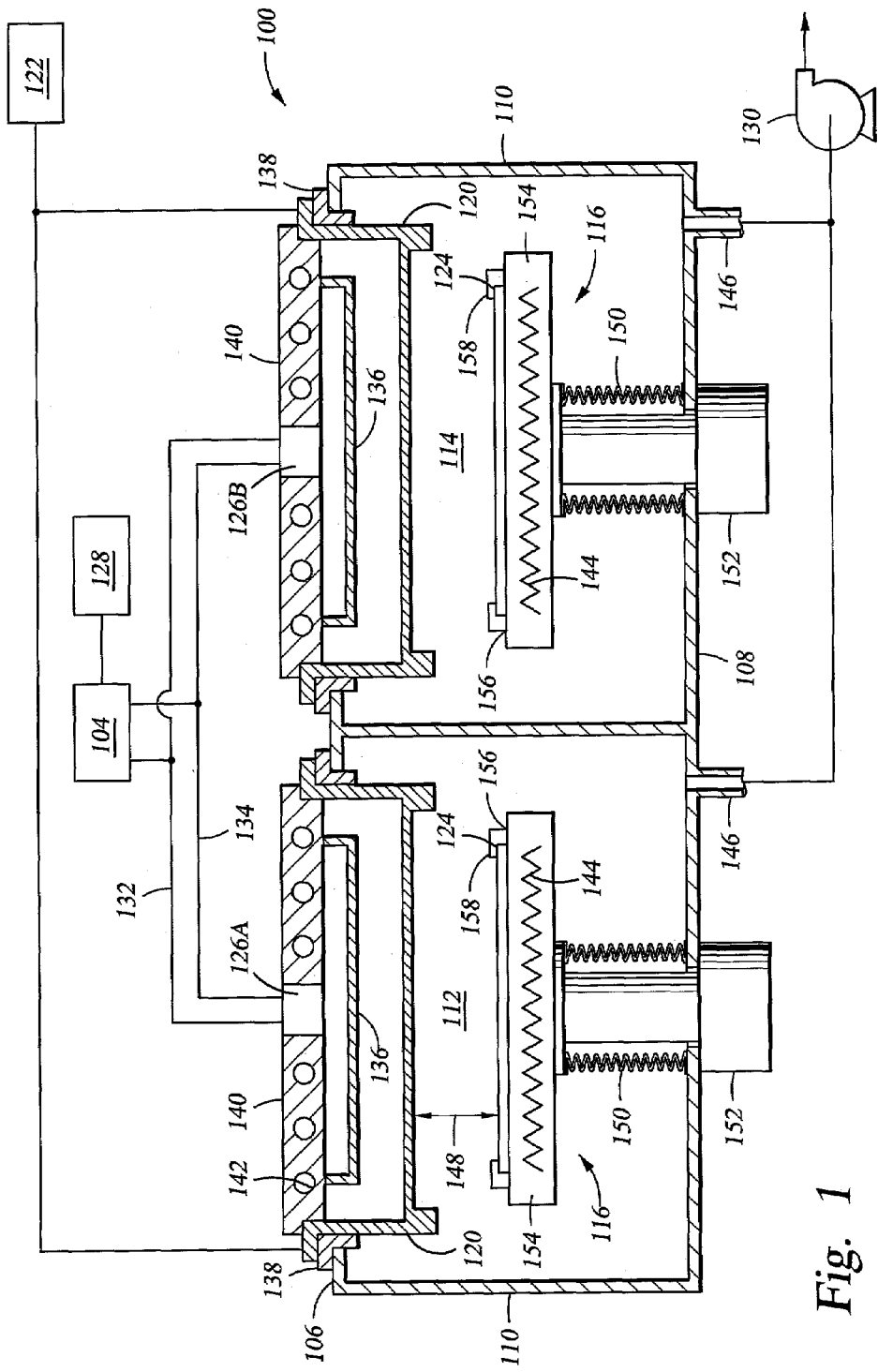
FIG. 1 is a simplified sectional view a substrate processing system having gas distribution showerheads respectively disposed above multiple processing regions.

FIG. 1 depicts a 200 mm substrate processing system 100 that includes a gas distribution system 104 coupled to a chamber body 102 having at least one substrate processing region. In the embodiment depicted in FIG. 1, the chamber body 102 includes a first processing region 112 and a second processing region 114. One processing chamber that may be adapted to benefit from the invention is a PRODUCER™ chemical vapor deposition system, available from Applied Materials, Inc.

A showerhead 120 is respectively disposed above each processing region 112, 114 of the chamber body 102 to provide uniform distribution of gas within the chamber body 102. Although the showerhead 120 provides common hardware that enables in-situ deposition of organosilane films such as silicon oxide and silicon nitride, the showerhead 120 is also useful in other processes (including deposition and etch) where uniform gas distribution is desired.

The exemplary chamber body 102 generally comprises a lid 106, a bottom 108 and sidewalls 110. At least one interior wall 116 is disposed between the lid 106 and bottom 108 of the chamber body 102 to separate the first processing region 112 from the second processing region 114. Although the processing regions 112, 114 are depicted as integral to a single chamber body 102, the regions 112, 114 (and other processing regions) may alternatively be disposed in a plurality of individual chambers or a single chamber with dividing walls.

Exhaust ports 146 disposed in the chamber body 102 generally couple the processing regions 112, 114 to a vacuum pump 130. Typically, the exhaust ports 146 are disposed in the bottom 108 of the chamber body 102, but may be located in other portions of the chamber body 102. A throttle valve (not shown) is generally disposed between the pump 130 and each exhaust port 146 and is utilized to regulate pressure in the processing regions 112, 114. Optionally, each exhaust port 146 may be coupled to a dedicated vacuum pump.

Each processing region 112 and 114 includes a substrate support 118 disposed therein that is coupled to the chamber bottom 108 or the sidewalls 110. The substrate support 118 supports a substrate 124 during processing. The substrate support 118 may retain the substrate 124 by a variety of methods, including electrostatic attraction, vacuum or mechanical clamping, gravity or other holding methods that can be used to retain a substrate to a substrate support during processing.

Each substrate support 118 is coupled to a lift mechanism 152 that controls the elevation of the substrate support 118 relative to the showerhead 120. The substrate support 118 may be lowered by the lift mechanism 152 to facilitate substrate transfer through substrate access port (not shown) disposed in the sidewalls 110 of the chamber body 102. Conversely, the substrate support 118 may be raised towards the showerhead 120 to set a gap (or spacing) 148 between the substrate 124 and the showerhead 120. Bellows 150 are coupled between the lift mechanism 152 and the chamber bottom 108 to prevent vacuum leakage.

The substrate support 118 includes a body 154 having an upper surface 156 that supports the substrate 124. The upper surface 156 typically has a diameter that is greater than the diameter of the substrate 124 and supports a cover ring 158. The cover ring 158 generally prevents deposition on the perimeter of the substrate 124 during processing.

The substrate support 118 also includes heating element 144 utilized to thermally control the temperature of a 200 mm substrate 124 seated on the upper surface 156 of the body 154. The heating element 144 may be a resistive heater, a fluid conduit for flowing a heat transfer fluid or a thermoelectric device among other temperature control devices. The heating element 144 typically has an outer diameter of at least 9.07 inches. In the embodiment depicted in FIG. 1, the heating element 144 is a resistive heater capable of heating and maintaining the substrate 124 at a temperature of about 200 to about 450 degrees Celsius.

Gas boxes 140 are disposed in the lid 106 of the chamber body 102 over the substrate support 118 disposed in processing region 112, 114. The gas box 140 may include one or more passages 142 at least partially formed therein to facilitate thermal control of the gas box 140. Each gas box 140 is coupled to the gas distribution system 104.

The gas distribution system 104 includes at least a first gas supply circuit 132 and a second gas supply circuit 134. The first gas supply circuit 132 provides at least a first process gas to each processing region 112, 114. The first gas supply circuit 132 is respectively coupled to a first and a second mixing blocks 126A, 126B disposed in the lid 106 of the chamber body 102. The first gas supply circuit 132 may be at least partially routed through the lid 106 or walls 110 of the chamber body 102 to thermally condition the gases prior to mixing and delivery into the processing regions 112, 114.

The second gas supply circuit 134 is generally coupled to the first and second mixing blocks 126A, 126B and provides a second process gas thereto. As with the first gas supply circuit 132, at least a portion of the second gas supply circuit 134 may be at least partially routed through the lid 106 or walls 110 of the chamber body 102 to thermally condition the gases.

The gas distribution system 104 is contemplated to include alternative configurations for the delivery of processing gases to the mixing blocks 126A, 126B. In one example of an alternative configuration, a gas distribution system includes a first gas supply circuit that delivers a first processing gas to the mixing blocks 126A, 126B, a second gas supply circuit that delivers a second processing gas to the first mixing block 126A, and a third gas supply circuit that delivers a third processing gas to the second mixing block 126B. One such gas delivery system is described in U.S. patent application Ser. No. 09/896,124, filed Jun. 29, 2001 by Gelatos et al., which is hereby incorporated by reference in its entirety.

A cleaning agent generator 128 may also be coupled to the processing regions 112, 114 through the gas distribution system 104. In one embodiment, the cleaning agent generator 128 provides a cleaning agent, such as atomic fluorine, that removes unwanted deposition and other contaminants from the chamber components. One such generator is available from Azte Corporation.

Mixing blocks 126A, 126B are generally disposed in the lid 106 of the chamber body 102 and fluidly couple each processing regions 112, 114, respectively, to the gas distribution system 104. The mixing blocks 126A, 126B mix the process and/or other gases delivered from the gas distribution system 104 and inject the mixed (or partially mixed) gases into a first plenum defined between a blocker plate 136 and the lid 106 of the chamber body 102. The blocker plate 136 distributes the gases radially to a second plenum defined between the showerhead 120 and the blocker plate 136. The mixed gases then flow through the showerhead 120 into the processing regions 112, 114. A mixing block that may be adapted to benefit from the invention is described in U.S.

patent application Ser. No. 09/609,994, filed Jul. 5, 2000 by Shmurun et al., which is hereby incorporated by reference in its entirety.

The blocker plate 136 is coupled to the lid 106 of the chamber body 102 and forms the first plenum therewith below each mixing block 126A, 126B. The blocker plate 136 is generally perforated to distributes the gases flowing out each mixing block 126A, 126B radially.

The showerhead 120 is generally coupled to the lid 106 of the chamber body 102 between each blocker plate 136 and substrate support 118. The showerhead 120 generally distributes process and other gases uniformly to the processing regions 112, 114 to enhance deposition uniformity. A RF power source 122 is coupled to the showerhead 120. RF power, applied to the showerhead 120 during processing, typically ignites and sustains a plasma of the mixed process gas(es) and/or other gases within the respective processing regions 112, 114 which generally facilitates lower processing temperatures with increased deposition rates. A dielectric isolator 138 is disposed between the showerhead 120 and the lid 106 of the chamber body 102 to electrically isolate the RF hot showerhead 120 from the chamber body 102. Plasma enhanced processing also provides additional process flexibility and provides a capability for the system 100 to be used for varied types of deposition processes.

Figure 2:
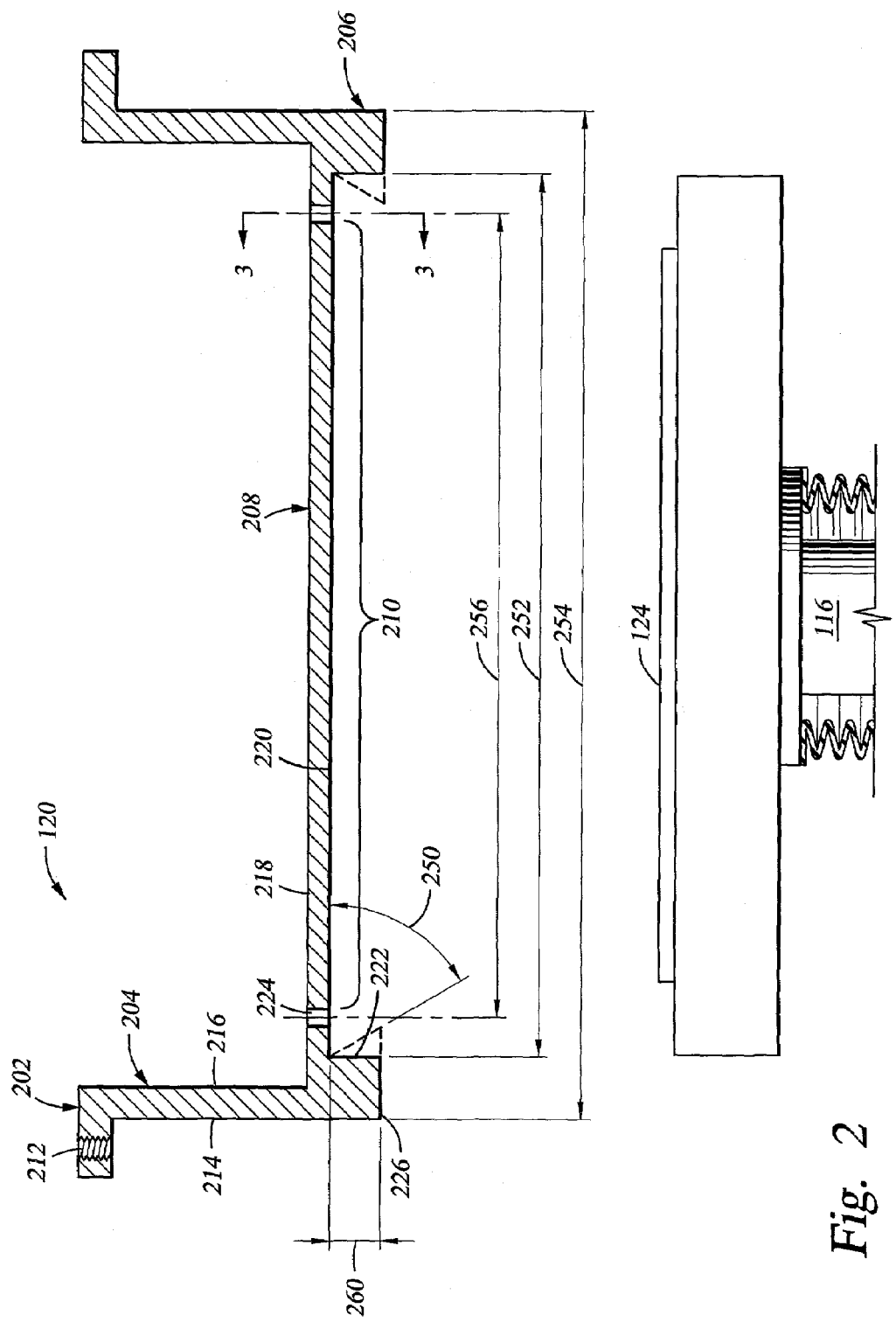
FIG. 2 is a sectional view of one embodiment of a showerhead.

FIG. 2 is a plan view of one embodiment of a showerhead 120 that is adapted to process various types of low-k dielectric material. The showerhead 120 generally includes an annular body 204 coupled between an annular flange 202 and a face plate 208. The showerhead 120 is typically fabricated from a single, unitary block of material, but may alternatively be comprised of individual members joined in a gas-tight manner. The showerhead 120 is generally fabricated from a RF conductive material such as nickel-plated aluminum, nickel, stainless steel or graphite, among others.

The flange 202 extends outwardly from the body 204 to support the showerhead 120 on the lid 106 of the chamber body 102 (as shown in FIG. 1). The flange 202 has one or more threaded holes 212 that facilitate electrically coupling the showerhead 120 to the power source 122.

The body 204 extends from the flange 202 towards the substrate support 118. The body 204 is typically cylindrical or conical in form. The end of the body 204 opposite the flange 202 is closed by the face plate 208. The body 204 has an outer diameter surface (outer surface 214) and an inner diameter surface (inner surface 216). The outer surface 214 of the body 204 generally extends beyond the face plate 208 and becomes part of a lip 206.

The lip 206 extends below the face plate 208 opposite the body 204 into the processing regions 112, 114 between the showerhead 120 and the substrate support 118. The lip 206 is configured to focus the plasma between the showerhead 120 and substrate support 118 which results in better deposition uniformity of low-k dielectric materials to be deposited.

In one embodiment, the lip 206 is defined by a portion of the outer surface 214, an end 226 and an inner wall 222. The end 226 is coupled between the outer surface 214 and the inner wall 222. The end 226 is typically parallel to the face plate 208. The end 226 generally has an outer diameter 254 of about 9.75 to about 9.755 inches and an inner diameter 258 of about 9.095 to about 9.105 inches. The inner diameter 258 of the lip 206 is typically less than the diameter of the substrate support 118 while the outer diameter 254 is greater than the diameter of the substrate support 118.

The inner wall 222 is generally perpendicular to the face plate 208. Alternatively, the inner wall 222 may define an angle 250 (shown in phantom in FIG. 2) with the face plate 208 between about 80 to about 90 degrees.

The face plate 208 is generally parallel to the flange 202 and includes a first side 218 and a second side 220. The first side 218 is coupled to the inner surface 216 of the annular body 204 and faces the blocker plate 136 (shown in FIG. 1). The second side 220 of the face plate 208 is oriented towards the substrate support 118. The face plate 208 also includes a perforated center portion 210 through which gases are distributed into the respective processing regions 112, 114. The perforated center portion 210 includes about 2000–3000 apertures 224 formed therethrough. Only the two outermost apertures 224 are shown in FIG. 2 for clarity.

The apertures 224 are generally patterned to promote uniformed deposition of material on the substrate 124 positioned below the showerhead 120. The outermost apertures 224 are located on a bolt circle 256 having a diameter of about 8.695 to about 8.705 inches. In the embodiment depicted in FIG. 2, 2,465 apertures 224 are formed in the center portion 210, with the outermost apertures 224 being located on a bolt circle 256 having a diameter of about 8.7 inches.

Figure 3:
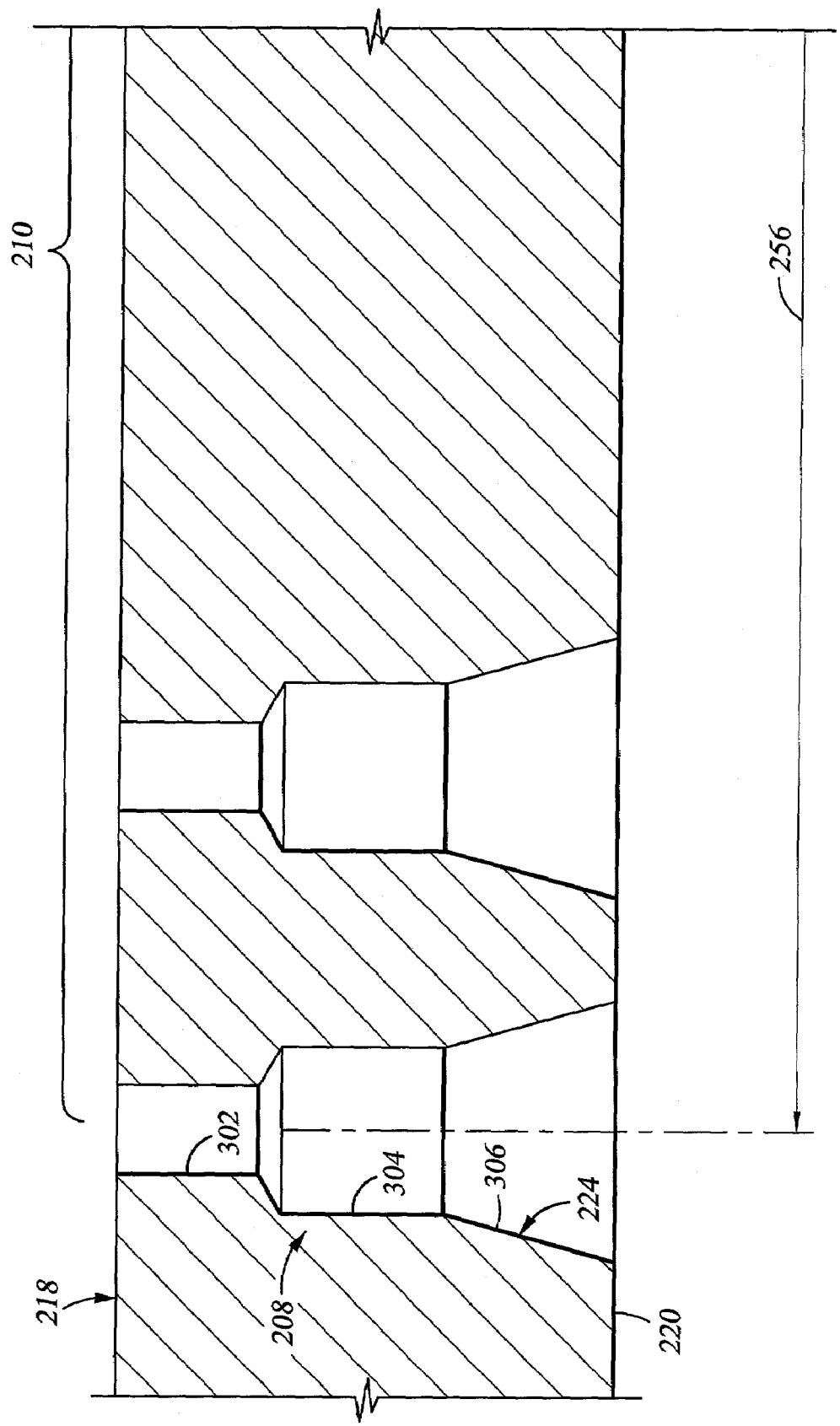
FIG. 3 is a sectional view of the showerhead of FIG. 2 taken along section lines 2—2.

Referring to FIG. 3, in one embodiment, each aperture 224 is comprised of a restrictive section 302, a center passage 304 and a flared opening 306. The restrictive section 302 passes from the first side 218 of the face plate 208 and is coupled to the center passage 304. The center passage 304 has a larger diameter than the restrictive section 302. The restrictive section 302 has a diameter selected to allow adequate gas flow through the face plate 208 while providing enough flow resistance to ensure uniform gas distribution radially across the perforated center portion 210.

The flared opening 306 is coupled to the center passage 304 and has a diameter that tapers radially outwards from the center passage 304 to the second side 220 of the face plate 208. The flared openings 306 promote plasma ionization of process gases flowing into the processing regions 112, 114. Moreover, the flared openings 306 reduces the surface area of the second side 220 of the face plate 208 (relative to conventional holes), resulting in dramatically less area available on the second side 220 available for the condensation and generation of films, which extends the number of substrates that can be processed between cleaning operations.

Figure 4:
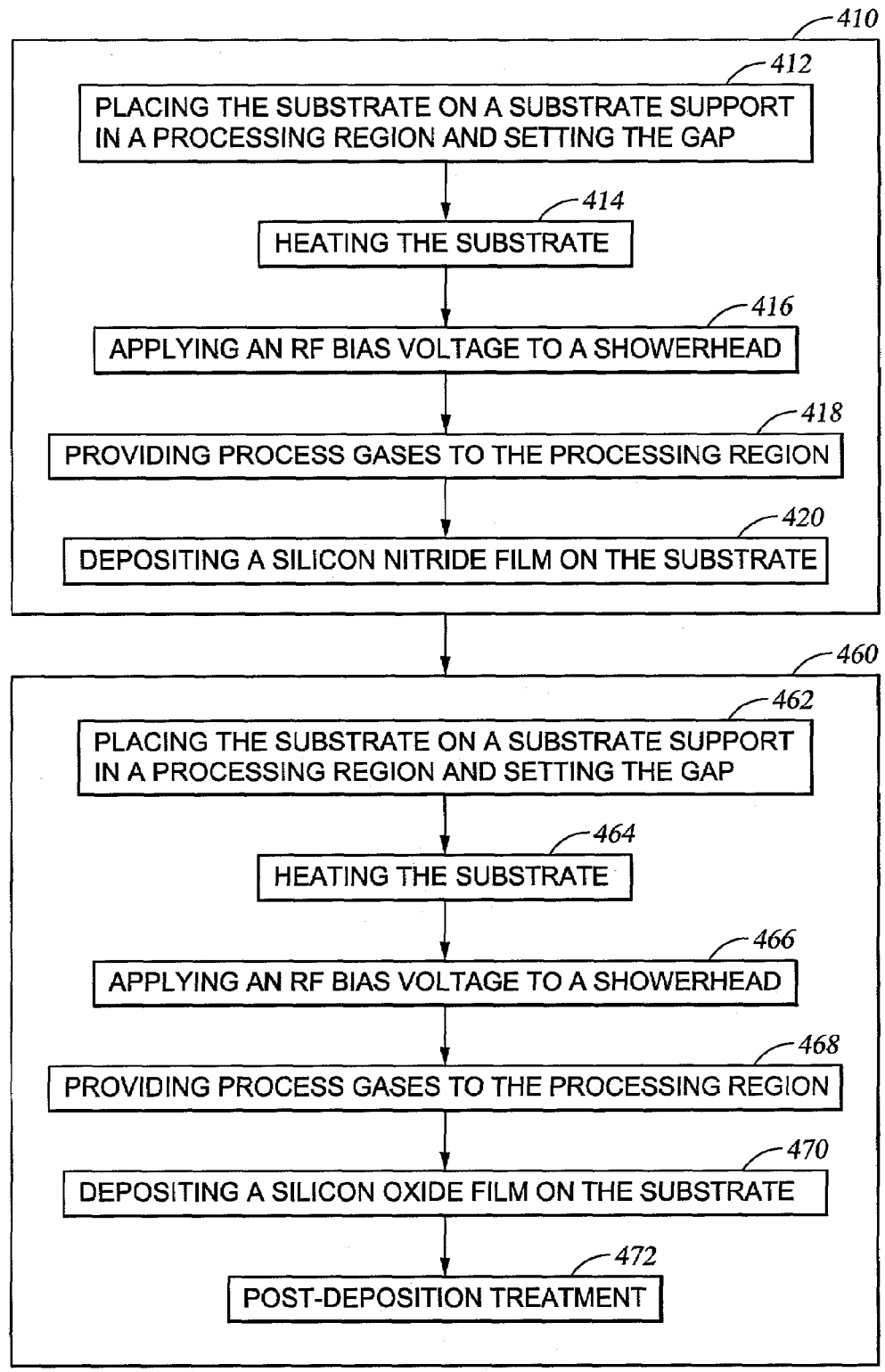
FIG. 4 is a flow diagram of one embodiment of a dielectric deposition process that may be practiced in the processing system of FIG. 1.

FIG. 4 depicts a flow diagram of one embodiment of a dielectric process 400 that may be practiced in the processing system 100 of FIG. 1. The process 400 includes performing at least one silicon nitride deposition process 410 or a silicone oxide deposition process 460 in a processing system adapted to perform either process 410, 460 without hardware (i.e., process kit) change. The processes 410, 460 may be performed singularly without the performing other process, or the processes 410, 416 may be performed in-situ (i.e., without removing the substrate 124 from the chamber body 102. Although the processing system 100 facilitates processing substrates in each processing region 112, 114, the process 400 is described below for clarity with reference to processing one substrate in a single processing region (e.g., the first processing region 112), as the process 400 may be performed in systems having single or multiply processing regions.

The process 410 begins at step 412 by placing the substrate 124 on the substrate support 118 and adjusting the spacing 148 between the substrate 124 and the showerhead 120 from about 200 to about 900 mils. At step 414, the substrate 124 is heated to about 300 to about 400 degrees Celsius. Typically, the heating or temperature control of the substrate 124 is achieved by heating the substrate 124 using the substrate support 118, which in one embodiment includes a resistive heating element. In one embodiment, the spacing 148 is set at about 300 to about 320 mils, and the substrate 124 is heated to about 300 degrees Celsius.

At step 416, a RF bias voltage of about 200 to about 800 Watts is applied to the showerhead 120. Process gases are then delivered to the processing region 112 through the showerhead 120 at step 418.

In one embodiment, step 418 includes providing $SiH_4$ (silane) at a rate of about 100 to about 300 and a nitrogen comprising gas, such as $NH_3$ at a rate of about 200 to about 400 sccm. Typically, the chamber pressure is maintained at about 3 Torr. Alternatively, other process gases such as tetramethyl silane, trimethyl silane among others may be utilized. Optionally, a carrier gas, such as argon, helium or other inert gas, is delivered with the other gases at a rate of about 200 to about 800 sccm. In another embodiment, the showerhead 120 is biased with about 300 Watts, $SiH_4$ is provided at a rate of about 150 sccm, $NH_3$ is provided at a rate of about 300 sccm, and helium is provided at a rate of about 150 sccm. At step 420, a layer of silicon nitride having a dielectric constant less than about 4.9 is deposited on the substrate 124 at a rate of about 1600 Å/min.

Figure 5:
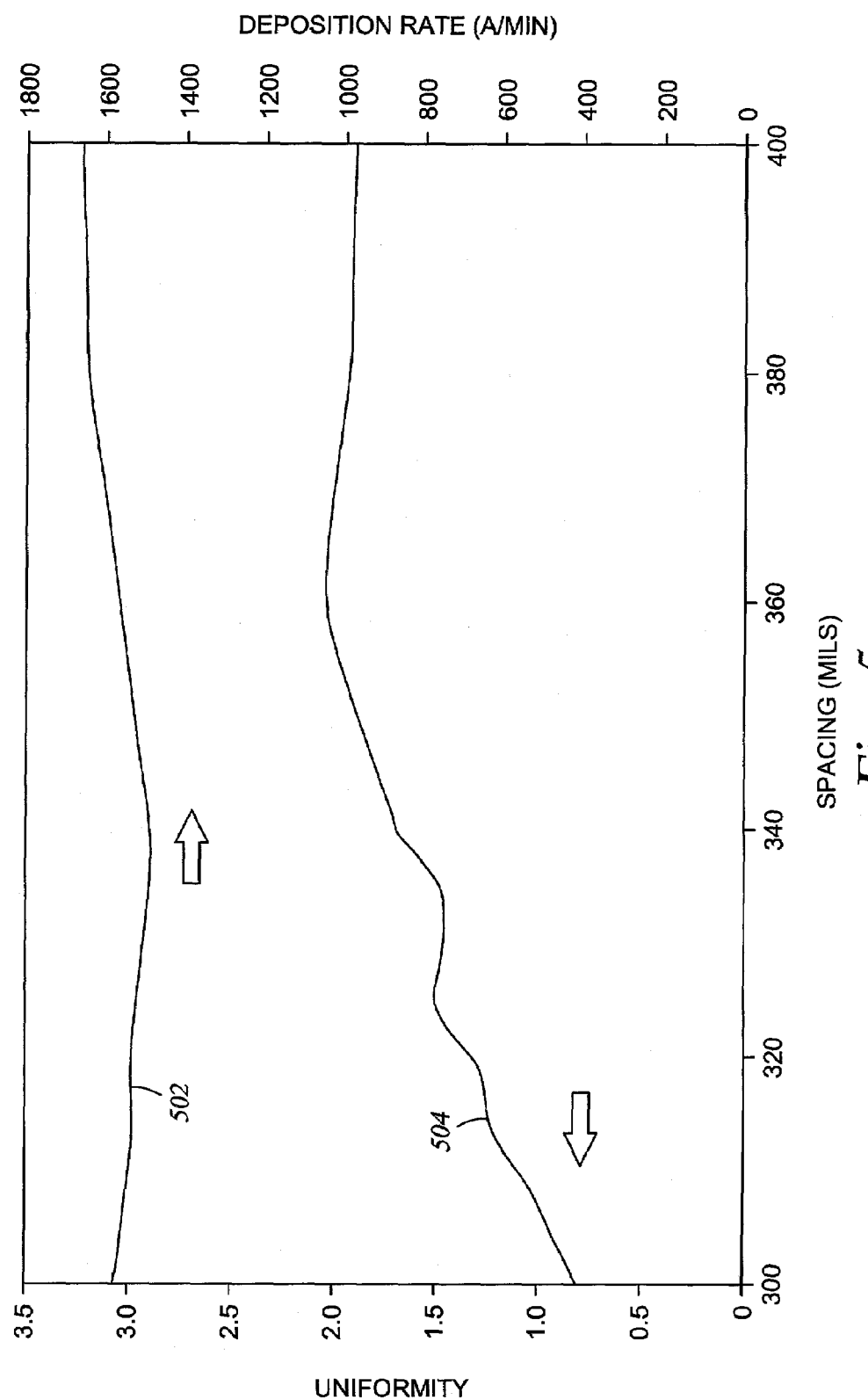
FIG. 5 is a graph depicting the effect of spacing in silicon nitride deposition.

FIG. 5 depicts a diagram of film deposition rates and uniformity verse spacing for the process 410. The left vertical axis represents film thickness uniformity while the right vertical axis represents deposition rate. Film thickness was measured using spectroscopic ellipsometer. The horizontal axis represents the spacing 148 between the substrate 124 and the showerhead 120. Line 502 illustrates the relation between deposition rate and spacing. Line 504 illustrates the relation between uniformity and spacing which are generally in the acceptable range of less than about 2 percent, and preferably less than about 1.5 percent.

Returning to FIG. 4, the process 460 begins at step 462 by placing the substrate 124 on the substrate support 116 and adjusting the elevation of the substrate relative to the showerhead 120 to about 300 to about 400 mils. If the process 460 follows step 410 or vice versa, only the elevation of the substrate need be adjusted, if necessary. At step 464, the substrate 124 is heated to about 300 to about 400 degrees Celsius. In one embodiment, the spacing is set at about 360 mils and the substrate 124 is heated to about 350 degrees Celsius.

At step 466, a RF bias voltage of about 525 to about 850 Watts is applied to the showerhead 120. Typically, about 700 watts is applied. Process gases are then delivered to the processing region 112 through the showerhead 120 at step 468.

In one embodiment, step 468 includes providing a gas from the group consisting of tetraethyl oxysilane (TEOS), tetramethly silane, trimethly silane (TMS), or silane at a rate of about 1000 to about 1400 sccm and an oxidizer or oxygen containing gas at a rate of about 350 to about 450 sccm. The chamber pressure is maintained at about 4 Torr or greater, and preferably about 5 Torr or greater.

A carrier gas, such as helium or other inert gas, is delivered with the other gases at a rate of about 400 to about 800 sccm. The use of an inert carrier gas generally improves mechanical and other film properties of the silicon oxide film, such as hardness, higher deposition rate, and uniformity, and when processed at higher chamber pressures, yields lower dielectric constants in deposited films.

In another embodiment, TMS is provided at a rate of about 1200 sccm, oxygen is provided at a rate of about 300 sccm, and helium is provided at a rate of about 300 sccm. At step 470, a layer of silicon oxide having a dielectric constant less than about 2.95 is deposited on the substrate at a rate of about 8500 Å/min.

An optional post deposition treatment step 472 may be utilized to improve the adhesion of subsequent layers to the layer of silicon oxide deposited in step 460. The treatment step 472 generally includes flowing helium into the chamber at a rate of about 200 to about 10,000 sccm. Power of between about 50 to about 800 watts is applied to the showerhead 120. In one embodiment, the step 472 introduces 2800 sccm of helium through the showerhead 120 biased with 200 watts to plasma treat the silicon oxide layer for between about 5 to about 20 seconds. Plasma treatment results in improved adhesion of subsequent layers while increasing the dielectric value of the silicon oxide film less than about 0.5. Typically, the step 472 is performed at pressures greater than 8 Torr.

Figure 6A:
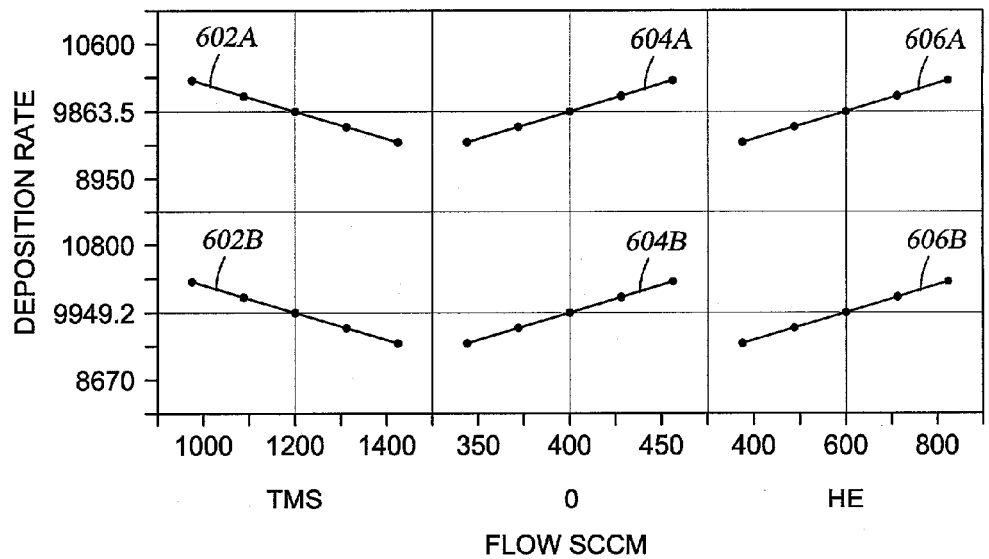
FIGS. 6A–D is a graph depicting the effect of gas flow rates in silicon oxide deposition.

FIGS. 6A–6D depict graphs illustrating the effects of flow rates upon the silicon oxide film deposited by the method 460. FIG. 6A has a vertical axis representing the deposition rate, while the horizontal axis represents the flow rates of trimethyl silane, oxygen and helium. Line 602A depicts the relationship between the flow of trimethyl silane and the deposition rate on a substrate processed in process region 112, while line 602B depicts the relationship between the deposition rate and the flow rate of trimethyl silane in processing region 114. Line 604A depicts the relationship between the deposition rate and the flow rate of oxygen in processing region 112, while line 604B depicts the relationship between the deposition rate and the flow rate of oxygen in procession region 114. Line 606A depicts the relationship between the deposition rate and the flow rate of helium in the processing region 112, while line 606B depicts the relationship between the deposition rate and the flow rate of helium in processing region 114.

Figure 6B:
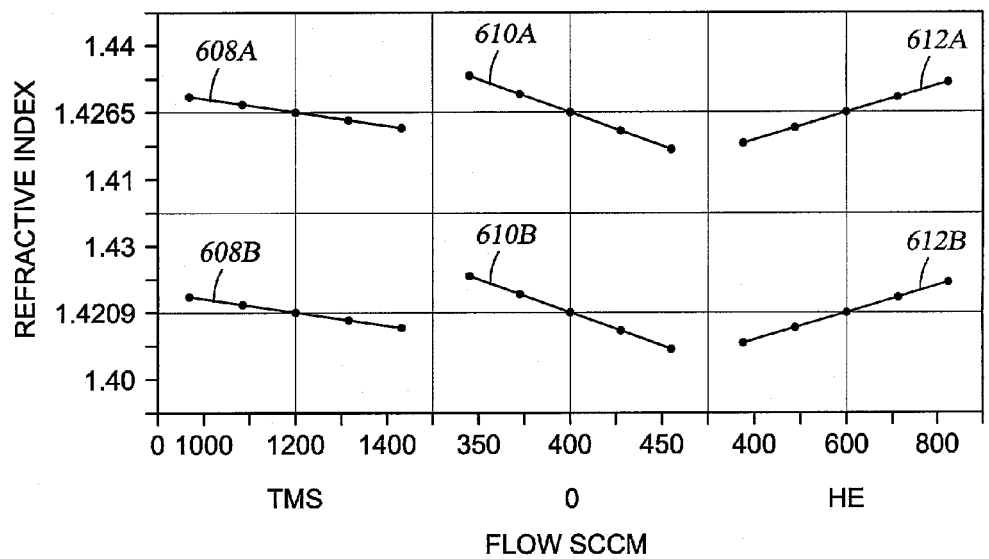

FIG. 6B depicts the relationship between the refractive index of silicon oxide films and the flow rates of process gases within process regions 112 and 114. Line 608A depicts the relationship between the refractive index and the flow rate of trimethyl silane on a substrate process in processing region 112, while line 608B depicts the relationship between the refractive index and the flow rate of trimethyl silane in processing region 114. Line 610A depicts the relationship between the refractive index and the flow rate of oxygen within processing region 112, while line 610B depicts the relationship between the refractive index and the flow rate of oxygen in processing region 114. Line 612A depicts the relationship between the refractive index and the flow rate of helium in processing region 112, while line 61 2B depicts the relationship between refractive index and the flow rate of helium in processing region 114.

Figure 6C:
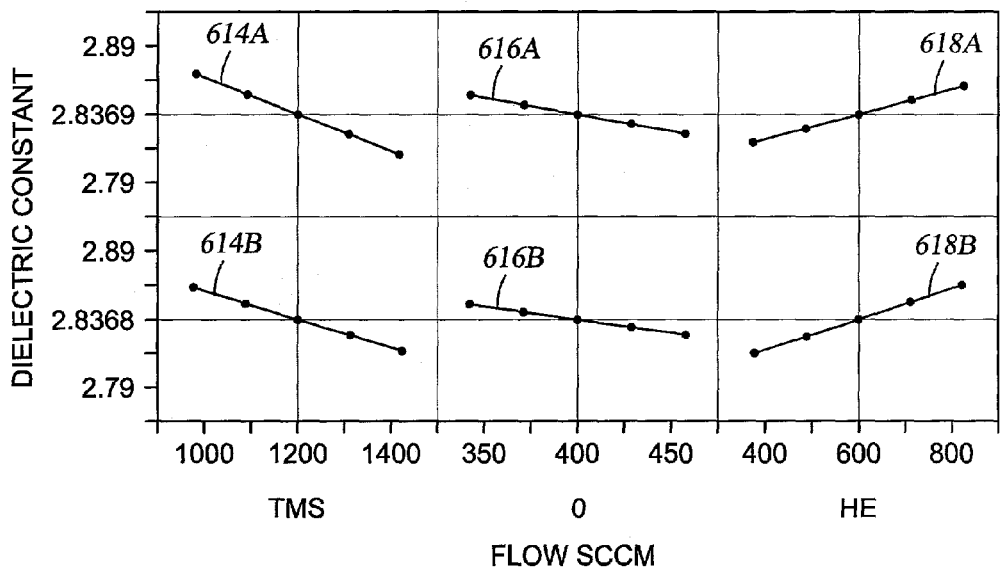

FIG. 6C depicts the relationship between the dielectric constant of the silicon oxide film and the flow rates of gases to substrates processed in processing regions 112 and 114. Line 614A depicts the relationship between the dielectric constant of the silicon oxide film and the flow rate of trimethyl silane in processing region 112, while line 614B depicts the relationship between the dielectric constant and the flow rate of trimethyl silane in processing region 114. Line 616A depicts the relationship between the dielectric constant and the flow rate of oxygen in processing region 112, while line 616B depicts the relationship between the dielectric constant and the flow rate of oxygen in processing region 114. Line 618A depicts the relationship between the dielectric constant and the flow rate of helium in processing region 112, while line 618B depicts the relationship between the dielectric constant and the flow rate of helium in processing region 114.

Figure 6D:
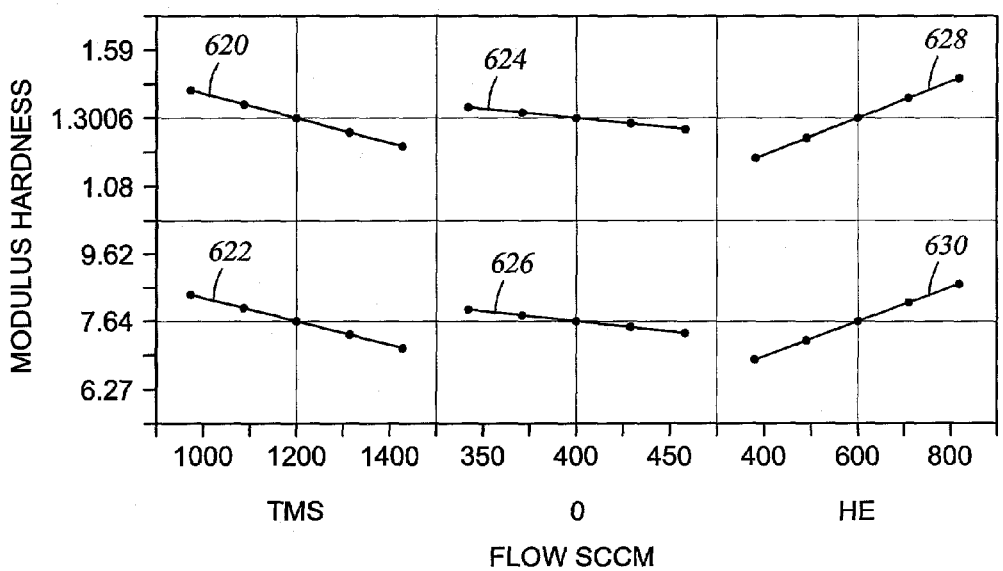
Figure 1:
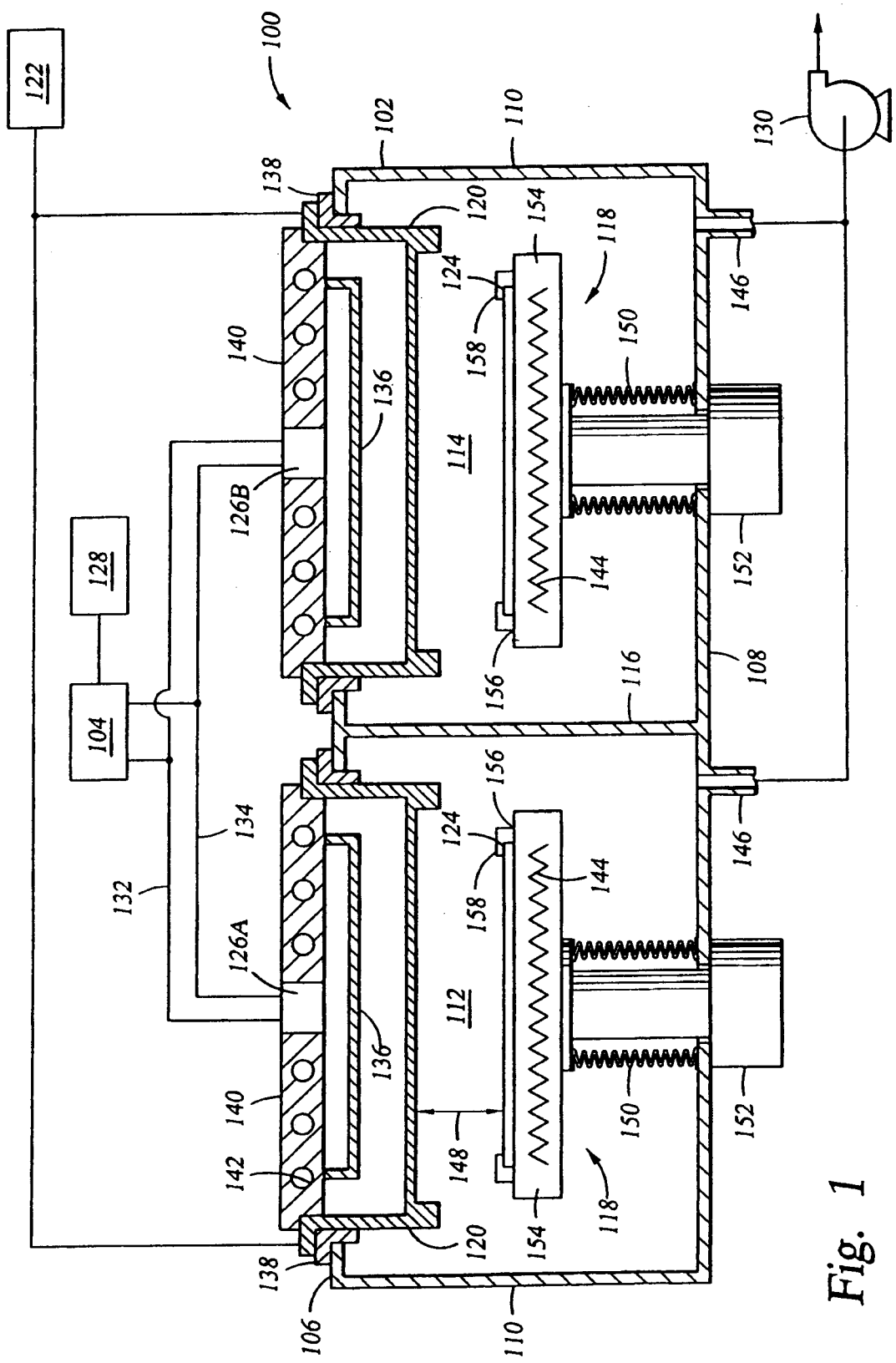
Figure 5:
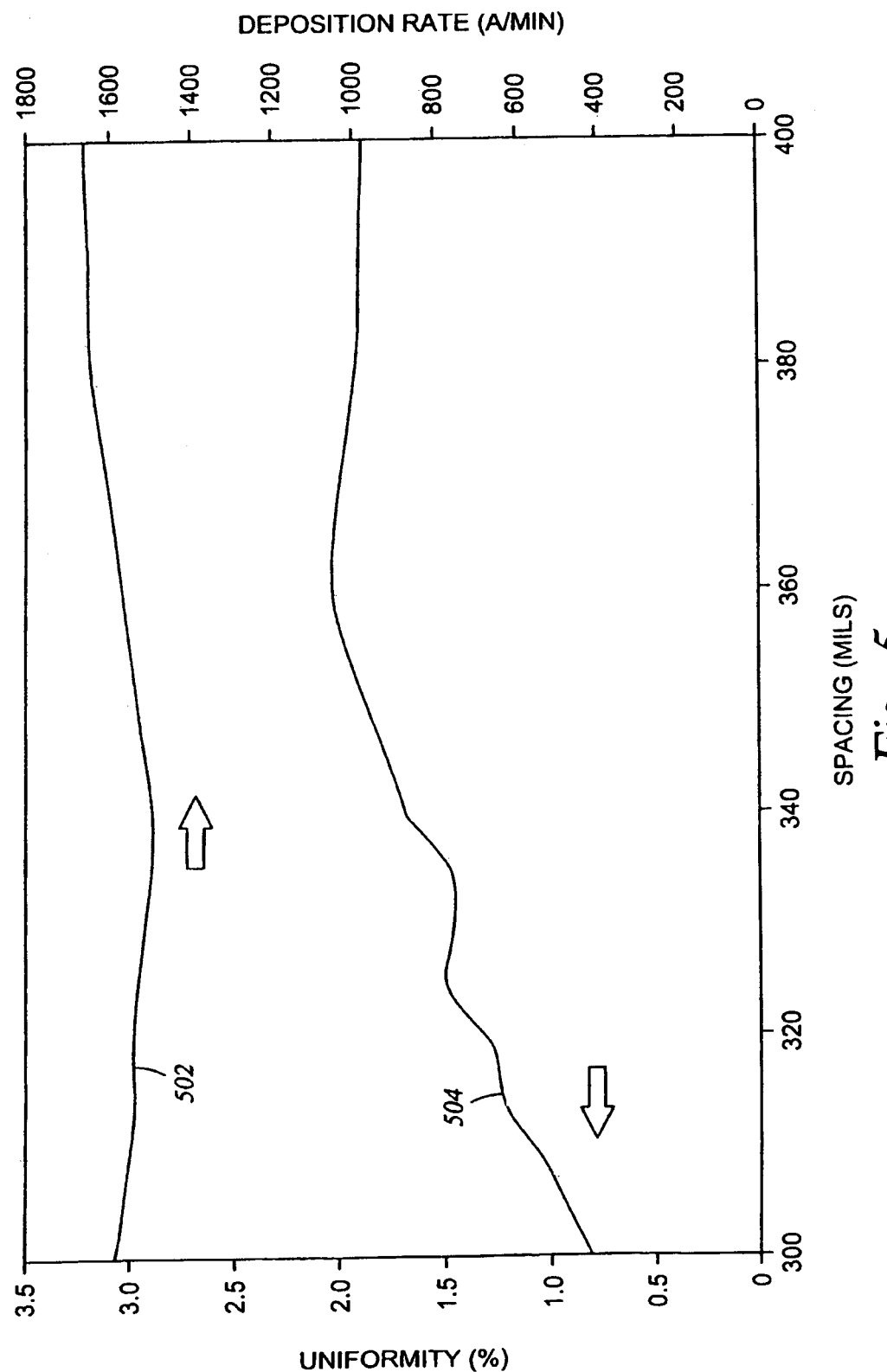
Figure 6A:
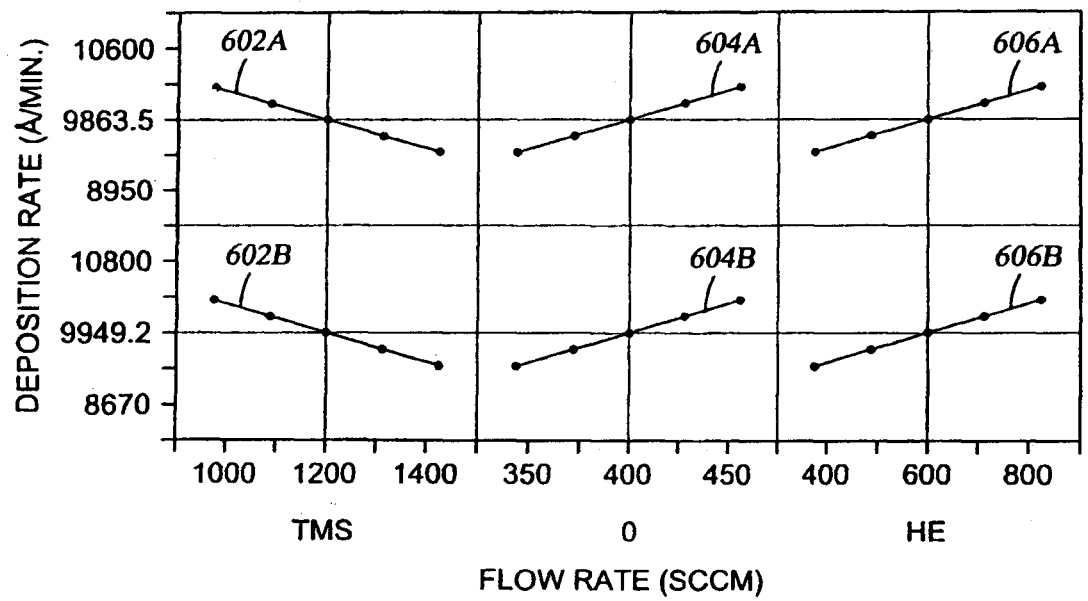
Figure 6B:
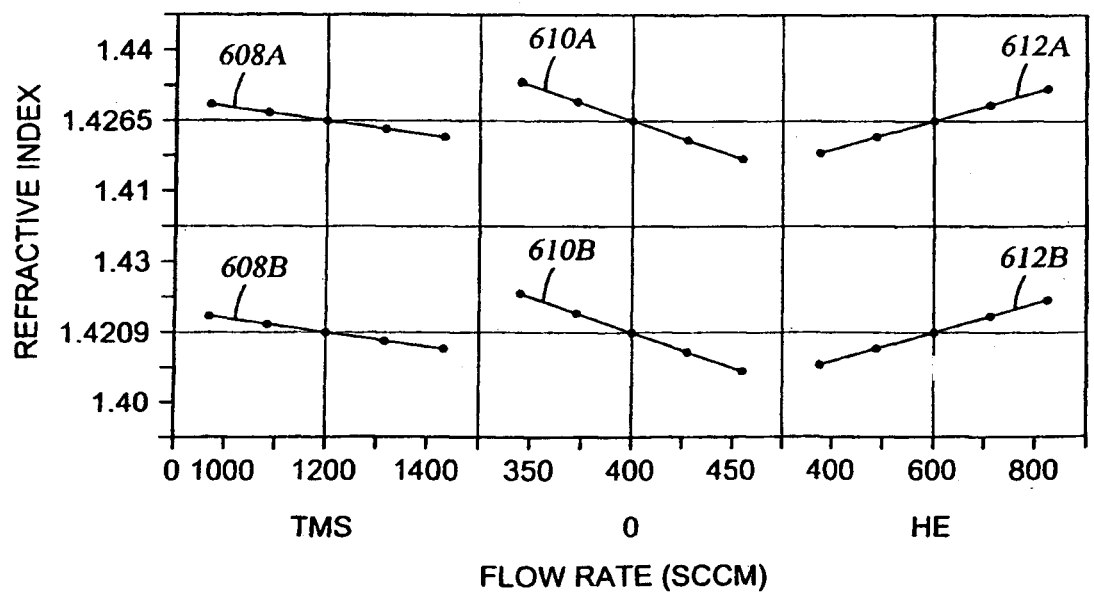
Figure 6C:
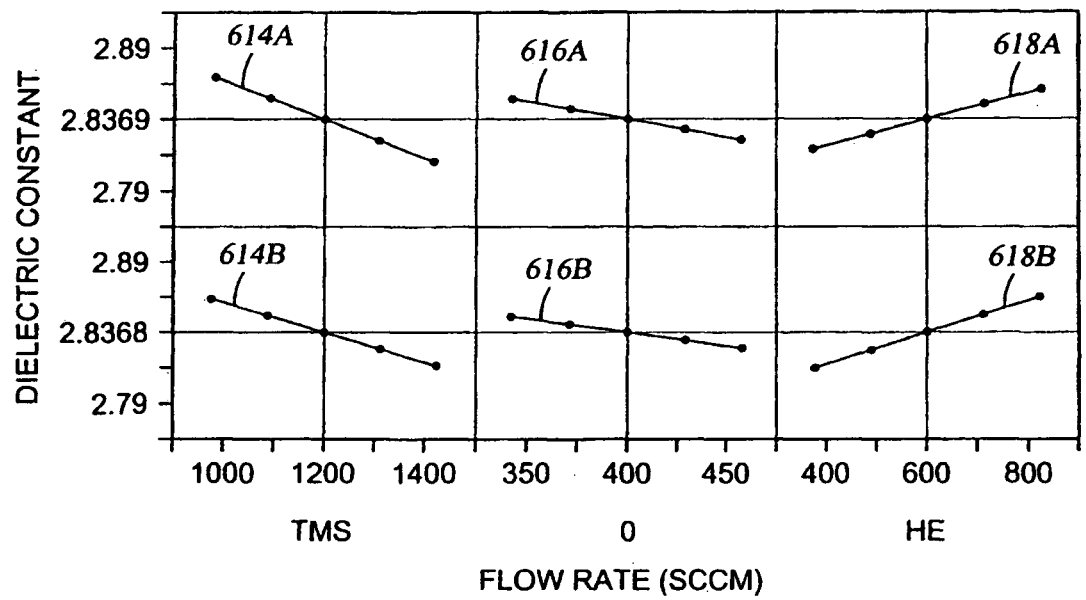
Figure 6D:
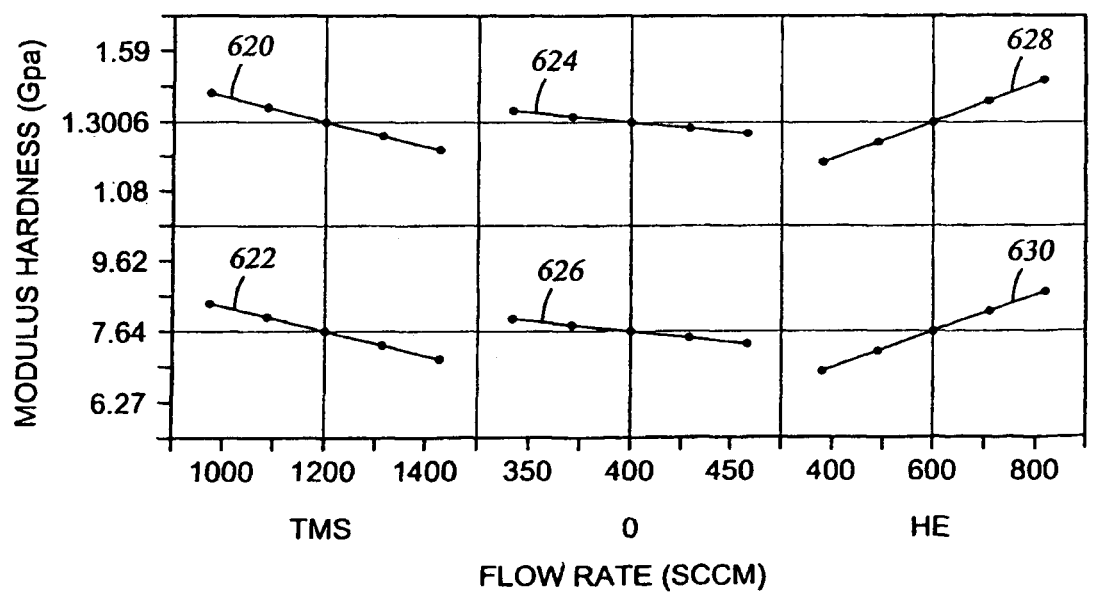

FIG. 6D depicts the relationship of film hardness and modulus relative to changes in flows to substrates processed utilizing the method 460. Line 620 depicts the relationship between film hardness and the flow rate of trimethyl silane and line 624 depicts the relationship between film hardness and the flow rate of oxygen, while line 628 depicts the relationship between film hardness and the flow rate of helium. Line 622 depicts the relationship between modulus and the flow rate of trimethyl silane, line 626 depicts the relationship between modulus and the flow rate of oxygen, while line 630 depicts the relationship between modulus and the flow rate of helium. Generally, a silicon oxide film deposited utilizing the method 460 exhibits deposition uniformity less than 1.5%, refractive index between 1.41–1.42, a dielectric constant between 2.8–2.85 and a hardness between 1.1–1.3 gpa.

Thus, a showerhead is provided that facilitates deposition of both silicon nitride and silicon oxide films without changing the process kit used in the processing chamber between deposition of each film. As a result, the cost of ownership is reduced and process flexibility is increased. Moreover, as deposition of both films may be performed in-situ, substrate is advantageously increased.

While the foregoing is directed to the preferred embodiment of the present invention, other and further embodiments of the invention may be devised without departing from the basic scope thereof. The scope of the invention is determined by the claims that follow.

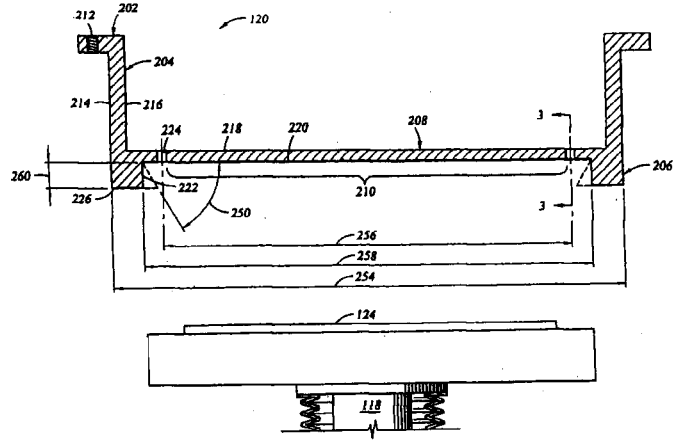

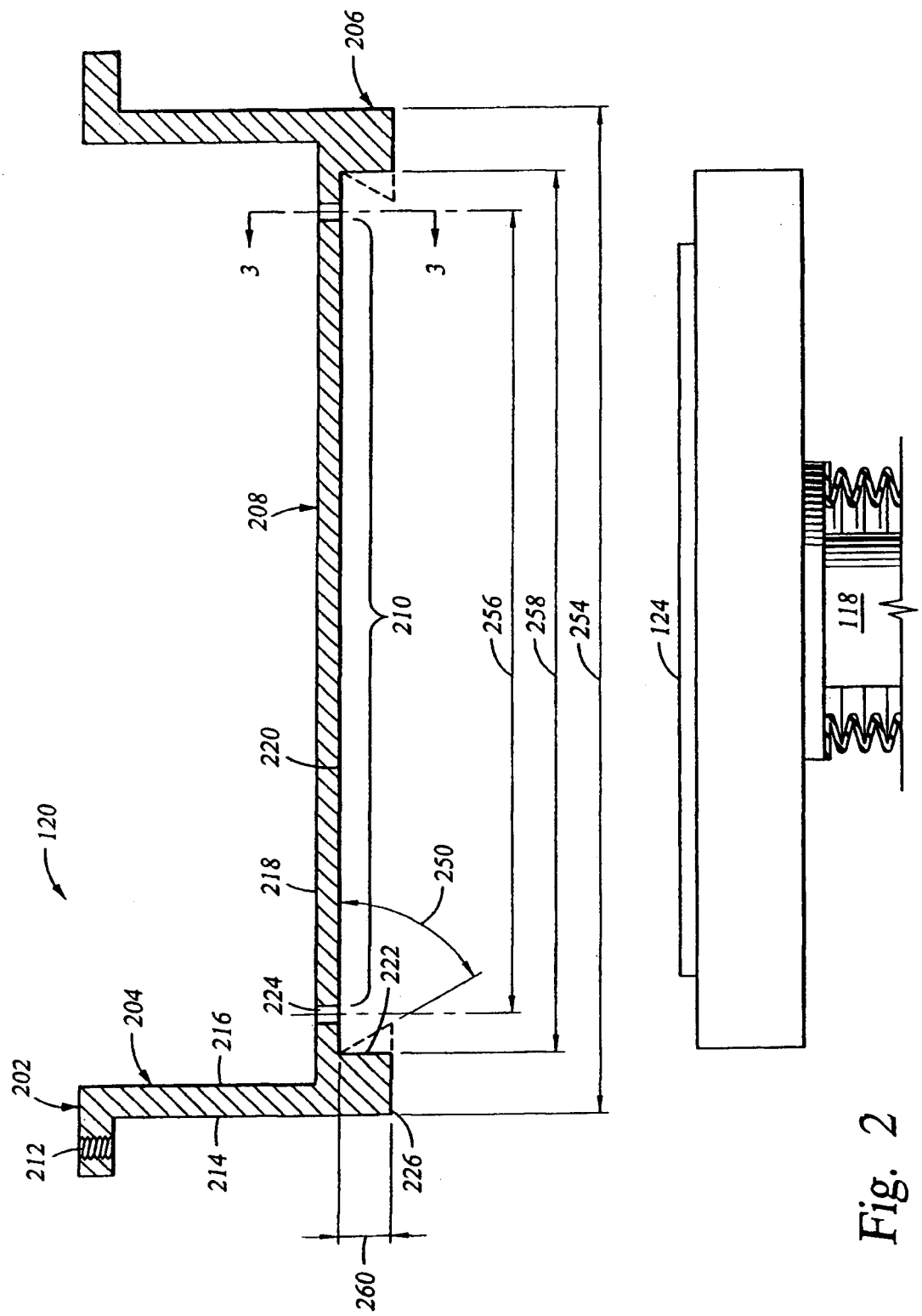

What is claimed is:

1. A showerhead for distributing gases in a processing chamber comprising:
   a face plate having a plurality of holes formed therethrough, each hole including a restrictive section, a center passage section, and an opening section;
   an annular body having a first end coupled to a first side of the face plate;
   a mounting flange coupled to a second end of the annular body; and
   an annular lip extending from a second side of the face plate opposite the mounting flange and defining a peripheral boundary to a plasma containing region.

2. The showerhead of claim 1, wherein the holes further comprise:
   a conical portion tapering toward the second side of the face plate.

3. The showerhead of claim 1, wherein at least a portion of the holes are arranged on a bolt circle of about 8.695 to about 8.705 inches in diameter.

4. The showerhead of claim 1, wherein the face plate has a diameter of greater than about 9.5 inches.

5. The showerhead of claim 1, wherein the lip defines an angle of between about 80 and about 90 degrees relative to the face plate.

6. The showerhead of claim 1, wherein the lip is perpendicular to the face plate.

7. A showerhead for distributing gases in a processing chamber comprising:
   a face plate having a plurality of at least partially tapered holes formed therethrough, each hole including a restrictive section, a center passage section, and an opening section;
   an annular body having a first end coupled to a first side of the face plate;
   a mounting flange coupled to a second end of the annular body; and
   an annular lip extending from a second side of the face plate opposite the mounting flange and defining an angle of between about 80 and about 90 degrees relative to the face plate, wherein the lip is adapted at least partially for confining a plasma proximate the face plate.

8. The showerhead of claim 7, wherein some of the holes are arranged on a bolt circle of about 8.695 to about 8.705 inches in diameter.

9. The showerhead of claim 7, wherein the lip is perpendicular to the face plate.

10. A processing chamber comprising:
    a chamber body;
    a lid disposed on the chamber body;
    a substrate support disposed in the chamber body;
    a face plate having a plurality of at least partially tapered holes formed therethrough, each hole including a restrictive section, a center passage section, and an opening section, the face plate disposed between the lid and the substrate support;
    an annular body having a first end coupled to a first side of the face plate;
    a mounting flange coupled to a second end of the annular body and coupled to the lid; and
    an annular a lip extending a second side of the face plate opposite the mounting flange and defining an angle of between about 80 and about 90 degrees relative to the face plate, wherein the lip is adapted at least partially for confining a plasma proximate the face plate, an inner diameter of the lip having a diameter less than a diameter of the substrate support.

11. The chamber of claim 10, wherein the holes formed in the face plate have a conical portion.

12. The chamber of claim 11, wherein the face plate has a diameter of greater than about 9.5 inches.

13. The chamber of claim 12, wherein the lip is perpendicular to the face plate.

14. The chamber of claim 12, wherein the plurality of holes number between about 2000 to about 3000 and are arranged in a polar array, an outermost row of holes arranged on a bolt circle of about 8.7 inches in diameter.

15. The chamber of claim 10, wherein the lip has an outer diameter greater than the diameter of the substrate support.

* * * * *

UNITED STATES PATENT AND TRADEMARK OFFICE
CERTIFICATE OF CORRECTION

| | | |
|---|---|---|
| PATENT NO. | : 7,008,484 B2 | Page 1 of 7 |
| APPLICATION NO. | : 10/140324 | |
| DATED | : March 7, 2006 | |
| INVENTOR(S) | : Kang Sub Yim et al. | |

It is certified that error appears in the above-identified patent and that said Letters Patent is hereby corrected as shown below:

The Title Page, showing an illustrative figure, should be deleted and substitute therefor the attached title page.

In the Drawings

Replace Drawing Sheet 1 with amended Replacement Drawing Sheet 1, copy attached.

Replace Drawing Sheet 2 with amended Replacement Drawing Sheet 2, copy attached.

Replace Drawing Sheet 5 with amended Replacement Drawing Sheet 5, copy attached.

Replace Drawing Sheet 6 with amended Replacement Drawing Sheet 6, copy attached.

Replace Drawing Sheet 7 with amended Replacement Drawing Sheet 7, copy attached.

In the Specification

Column 5, Line 7: Change "distributes" to --distribute--.

Column 7, Line 53: Change "tetramethly" to --tetramethyl--.

Column 7, Line 53: Change "trimethly" to --trimethyl--.

Column 8, Line 51: Change "61 2B" to --612B--.

In the Claims

Column 10, Claim 10, Line 37: After "annular", delete "a".

Signed and Sealed this

Twenty-second Day of March, 2011

David J. Kappos
*Director of the United States Patent and Trademark Office*

(12) United States Patent
Yim et al.

(10) Patent No.: US 7,008,484 B2
(45) Date of Patent: Mar. 7, 2006

(54) METHOD AND APPARATUS FOR DEPOSITION OF LOW DIELECTRIC CONSTANT MATERIALS

(75) Inventors: Kang Sub Yim, Mountain View, CA (US); Soovo Sen, Sunnyvale, CA (US); Dian Sugiarto, Sunnyvale, CA (US); Peter Lee, San Jose, CA (US); Ellie Yieh, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 533 days.

(21) Appl. No.: 10/140,324

(22) Filed: May 6, 2002

(65) Prior Publication Data
US 2003/0207033 A1    Nov. 6, 2003

(51) Int. Cl.
*C23C 16/00* (2006.01)
*C23F 1/00* (2006.01)
*H01L 21/306* (2006.01)

(52) U.S. Cl. ............ 118/715; 156/345.33; 156/345.34
(58) Field of Classification Search ............... 118/715, 118/728, 50; 156/345.29, 345.33, 345.34
See application file for complete search history.

(56) References Cited

U.S. PATENT DOCUMENTS

| | | | |
|---|---|---|---|
| 4,262,631 A | 4/1981 | Kubacki | 118/723 MP |
| 4,532,150 A | 7/1985 | Endo et al. | 427/577 |
| 4,634,601 A | 1/1987 | Hamakawa et al. | 438/485 |
| 4,759,947 A | 7/1988 | Ishihara et al. | 427/568 |
| 5,024,748 A * | 6/1991 | Fujimura | 204/298.38 |
| 5,238,866 A | 8/1993 | Bolz et al. | 427/595 |
| 5,465,680 A | 11/1995 | Loboda | 117/84 |
| 5,685,914 A * | 11/1997 | Hills et al. | 118/723 E |
| 5,711,987 A | 1/1998 | Bearinger et al. | 427/7 |
| 5,728,223 A * | 3/1998 | Murakami et al. | 118/715 |
| 5,730,792 A | 3/1998 | Camilletti et al. | 106/287.14 |
| 5,776,235 A | 7/1998 | Camilletti et al. | 106/287.1 |
| 5,780,163 A | 7/1998 | Camilletti et al. | 428/446 |
| 5,818,071 A | 10/1998 | Loboda et al. | 257/77 |
| 6,054,379 A | 4/2000 | Yau et al. | 438/623 |
| 6,072,227 A | 6/2000 | Yau et al. | 257/642 |
| 6,132,512 A * | 10/2000 | Horie et al. | 118/715 |
| 6,140,226 A | 10/2000 | Grill et al. | 438/637 |
| 6,147,009 A | 11/2000 | Grill et al. | 438/780 |
| 6,159,871 A | 12/2000 | Loboda et al. | 438/786 |

(Continued)

FOREIGN PATENT DOCUMENTS
EP    0 613 179    8/1994

OTHER PUBLICATIONS

U.S. Appl. No. 09/247,381, filed, Feb. 19, 2002, Cheung et al.

(Continued)

*Primary Examiner*—Ruby Zervigon
(74) *Attorney, Agent, or Firm*—Patterson & Sheridan

(57) ABSTRACT

A showerhead adapted for distributing gases into a process chamber and a method for forming dielectric layers on a substrate are generally provided. In one embodiment, a showerhead for distributing gases in a processing chamber includes an annular body coupled between a disk and a mounting flange. The disk has a plurality of holes formed therethrough. A lip extends from a side of the disk opposite the annular body and away from the mounting flange. The showerhead may be used for the deposition of dielectric materials on a substrate. In one embodiment, silicon nitride and silicon oxide layers are formed on the substrate without removing the substrate from a processing chamber utilizing the showerhead of the present invention.

15 Claims, 7 Drawing Sheets